United States Patent [19]
Tan

[11] Patent Number: 5,933,107
[45] Date of Patent: Aug. 3, 1999

[54] METHOD AND DEVICE TO PROVIDE A HIGH-PERFORMANCE DIGITAL-TO-ANALOG CONVERSION ARCHITECTURE

[75] Inventor: Nianxiong Tan, Sollentuna, Sweden

[73] Assignee: Telefonaktiebolaget LM Ericsson, Stockholm, Sweden

[21] Appl. No.: 08/962,685

[22] Filed: Nov. 3, 1997

[30] Foreign Application Priority Data

Apr. 11, 1996 [SE] Sweden ................................. 9604024

[51] Int. Cl.⁶ ....................................... H03M 1/66
[52] U.S. Cl. ............................. 341/144; 341/148
[58] Field of Search ............................ 341/144, 120, 341/145, 148, 153, 154

[56] References Cited

U.S. PATENT DOCUMENTS

| | | |
|---|---|---|
| 4,618,847 | 10/1986 | Iida et al. . |
| 4,763,107 | 8/1988 | Koen et al. ............................. 341/156 |
| 4,947,168 | 8/1990 | Myers ..................................... 341/120 |
| 5,070,331 | 12/1991 | Hisano . |
| 5,406,135 | 4/1995 | Kasai et al. . |

FOREIGN PATENT DOCUMENTS

| | | |
|---|---|---|
| 0 740 425A1 | 10/1996 | European Pat. Off. . |
| 32 02 789A1 | 8/1982 | Germany . |
| 3202789 C2 | 8/1982 | Germany . |
| 34 08 550A1 | 9/1984 | Germany . |
| 3408550 C2 | 9/1984 | Germany . |

OTHER PUBLICATIONS

PCT International–Type Search Report dated Aug. 19, 1997.
JeanMichel Fournier and Patrice Senn, "A 130–MHZ 8–b CMOS Video DAC for HDTV Applications", IEEE Journal of Solid–State Circuits, vol. 26, No. 7, Jul. 1991, pp. 1073–1077.

*Primary Examiner*—Brian Young
*Attorney, Agent, or Firm*—Burns, Doane, Swecker & Mathis, L.L.P.

[57] ABSTRACT

High-speed and high accuracy digital-to-analog (D/A) converters find many applications in signal processing. For wideband telecommunication systems, there is a strong demand on high-performance D/A converters. With the design of the present invention it is enabled to prevent distortions and intermodulations for high-speed and high-accuracy digital-to-analog (D/A) converters for telecommunication applications, where the requirements on distortion and intermodulation can be very stringent. By combining segmentation for MSBs and binary weighting for LSBs a high-performance digital-to-analog conversion architecture can be achieved, where a delay for the binary weighted LSBs is used to equalize a delay introduced by segmentation and where all bit switches (14) are clocked with a tree-like-clock distribution network (11). New floor plans for CMOS, BiCMOS and bipolar implementation are thus invented and circuits for CMOS bit switches and current sources are also disclosed.

7 Claims, 3 Drawing Sheets

METHOD AND DEVICE TO PROVIDE A HIGH-PERFORMANCE DIGITAL-TO-ANALOG CONVERSION ARCHITECTURE

FIELD OF THE INVENTION

The present invention relates to the design of high-speed and high-accuracy digital-to-analog (D/A) converters for telecommunication applications, where requirements on distortion and intermodulation are stringent. More specifically, the invention relates to a method and a device to provide a high-performance digital-to-analog conversion architecture by combining segmentation for the most significant bits (MSBs) and binary weighting for the least significant bits (LSBs) and especially circuit implementation techniques to decrease distortion and intermodulation.

BACKGROUND OF THE INVENTION

High-speed and high-accuracy digital-to-analog (D/A) converters find many applications in signal processing. For wideband telecommunication systems, there is a strong demand on high-performance D/A converters. The requirements of distortion and intermodulation on this kind of D/A converters are very tough.

One of the major reasons causing distortion and intermodulation is due to transient current spikes. To illustrate the problem of transient current spikes, there is shown in FIG. 1a a 3-bit binary weighted D/A converter. There are three current sources with values Io, 2Io and 4Io. When the digital input b0 is 1, the current Io is switched to the output; when the digital input b1 is 1, the current 2Io is switched to the output; and when the digital input b2 is 1, the current 4Io is switched to the output.

Suppose there is a code transition from 011 to 100. Since it cannot be guaranteed that every bit switch operates simultaneously, there are different temporary codes as illustrated in FIG. 1b. Therefore, current spikes, or glitches appear at the output before the final values is reached. The glitches usually introduce distortion.

To reduce the glitch energy, another technique which is called segmentation can be used. A 3-bit segmented D/A converter is shown in FIG. 2a. Unlike binary weighted D/A converters, there are only unit current sources in segmented D/A converters. The 3-bit digital input data is first decoded into 7 outputs $Q_{6 \sim 0}$ by a decoder 1. When the input data value is equal to J, there are only J outputs $Q_{(J-1) \sim O}$ (J=7~1) having the output of 1. When the input data is equal to zero, all the outputs $Q_{6 \sim 0}$ are zeros. When there is a code transition, say from 011 to 100 shown in FIG. 2b, there is only one bit switch $Q_3$ changing the state. Therefore, glitch energy is minimized provided there is not intermediate output from the decoder 1 at a code transition. This can be guaranteed by using a latch at the decoder output.

Segmentation has its drawback. It needs more current sources and bit switches compared with binary weighting. In binary weighted CMOS D/A converters, unit current sources are usually employed to increase matching. This makes the current sources in binary weighted and segmented D/A converters identical. However, due to the fact that many more bit switches and wires are needed in segmented D/A converters, segmented D/A converters usually have smaller bandwidth and consume more chip area. To design high-performance D/A converters, combination of segmentation and binary weighting is a good choice.

Architectures combining segmentation and binary weighting have been used. An example is shown in FIG. 3, taken from J. M. Fournier and P. Senn, "A 130-Mhz 8-b CMOS video DAC for HDTV applications", IEEE J. Sold-State Circuits, July 1991, pp. 1073–1077. However, data have different delay for segmentation and binary weighting parts, limiting the speed. Also bit switches are not clocked by clock signals distributed to guarantee equal delay. Another serious problem is the implementation. The layout is organized into a matrix with each cell containing a current source, bit switch and local decoder.

The 6-bit MSB data in the cited reference are fed from above and right to some initial decoding circuit and then latched with latches 2. The 2-bit LSB data in the cited reference are directly latched without the delay function to equalize the delay in the data path. Therefore, very high frequency operation is not possible. In the matrix, each cell contains current source, bit switch and local decoder, which inflicts several problems as follows:

1) the matching of current sources is poor. Matching is a function of distance between current sources. The larger the distance is, the poorer the matching is. Due to the local decoders and bit switches, the distance between current sources are quite large;

2) noise coupling is severe, because a lot of digital signal lines need to cross current sources. This problem gets severer with the increase of number of bits for segmentation; and 3) glitch energy is still very high. Even though the changing of states at the output of the latches can be clocked, the control signals for the bit switches may differ significantly at the transition instance due to the different wire length from the latches to every bit switch. This creates glitch energy, introducing distortion and intermodulation. And the problem gets more severe with the increase of number of bits for segmentation.

SUMMARY OF THE INVENTION

This invention relates essentially to the design of high-speed and high-accuracy D/A converters intended to be used in wideband telecommunication systems. Distortions and intermodulations in a D/A converter are usually due to the mismatch in the reference currents, as well as due to large transient current spikes. Large transient spikes occur, when all bits are not switched simultaneously at a major code transition. To reduce transient spikes an architecture is invented, where binary weighting is used for the least significant bits (LSBs) and segmentation is used for the most significant bits (MSBs), and where data delay from the input to the bit switches is equalized and where all bit switches are clocked by a tree-like clock distribution network. To further reduce transient spikes and increase matching new floor plans are invented and circuits for CMOS bit switches and current sources are disclosed.

DETAILED DESCRIPTION OF THE PREFERRED EMBODIMENTS

Figure 1A:
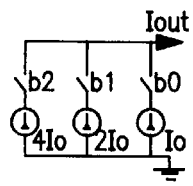
FIG. 1 a, b illustrate binary weighting and code transition in a 3-bit binary weighted D/A converter.
Figure 1B:
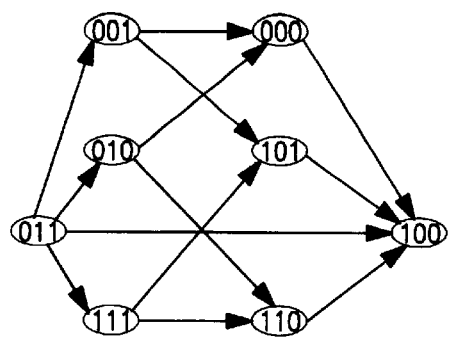
Figure 2A:
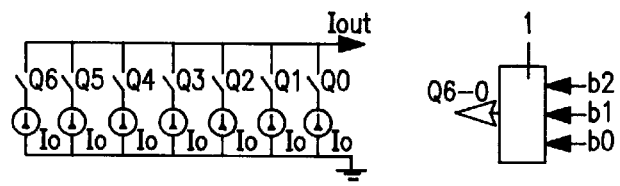
FIG. 2 a, b illustrate segmentation and code transition in a 3-bit segmentation D/A converter.
Figure 2B:
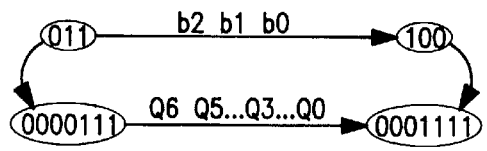
Figure 3:
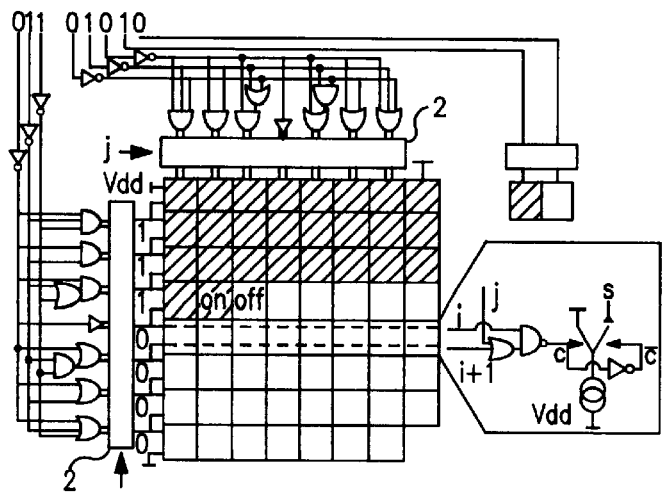
FIG. 3 is a traditional implementation of a D/A converter.
Figure 4A:
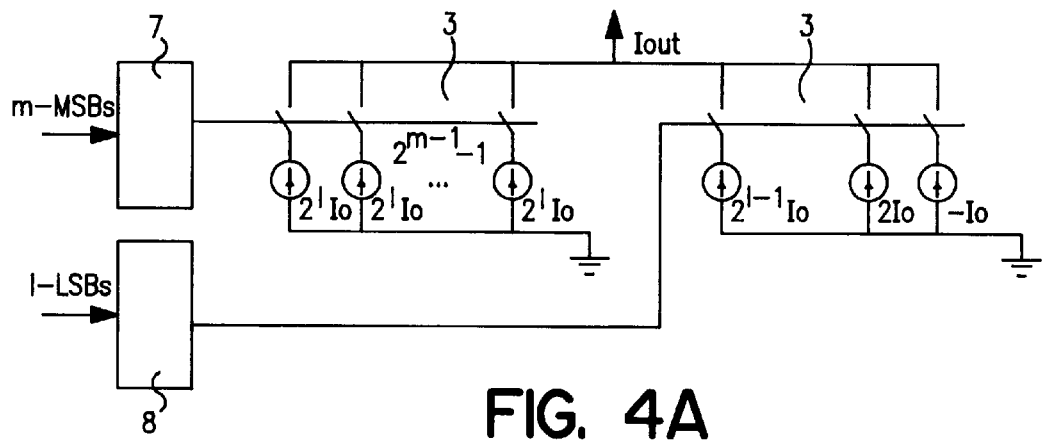
FIG. 4 a, b illustrate a high-performance D/A converter architecture combining segmentation for the MSBs and binary weighting for the LSBs according to the invention.
Figure 4B:
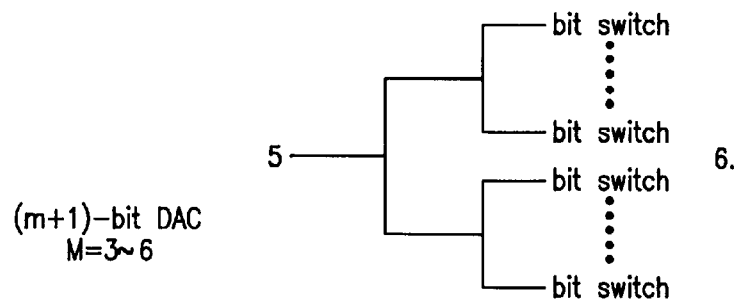

An architecture combining segmentation and binary weighting according to the invention is shown in FIG. 4a and b. To reduce glitch energy, m-MSBs are segmented; to reduce chip area, 1-LSBs are binary weighted. The $2^m-1$ current sources 3 for the m-MSBs are identical having the value of $2^1$Io. The current sources 4 for the 1-LSBs are binary weighted having the value from Io to $2^{1-1}$Io. Also, to reduce the glitch energy, a global clock tree 5 is used to clock all the bit switches 6 by means of flip-flops, as shown in FIG. 4b. The clock signal is distributed by a tree-like distribution network. To compensate for the delay in the segmentation decoder 7, a delay equalizer 8 consisting of chained inverters is used between the 1-LSB inputs and the 1-LSB bit switches. Due to the equalized delay among all the input data, the architecture is a good candidate for high-speed operation.

Figure 5:
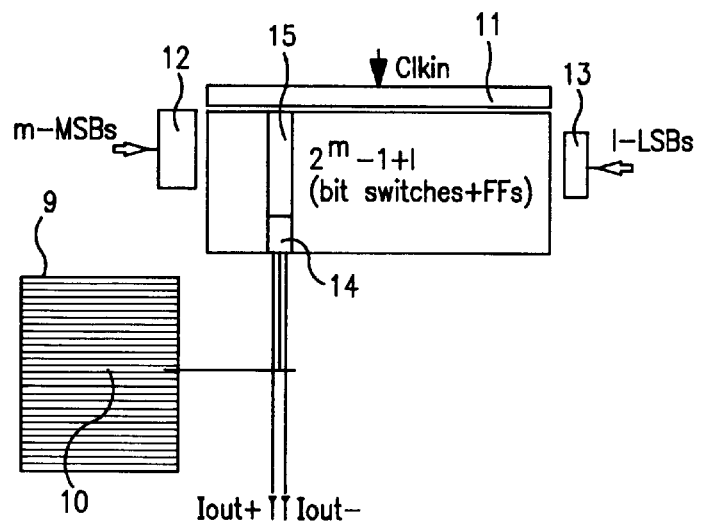
FIG. 5 is a floor plan for the CMOS D/A converters according to the invention.

A new CMOS implementation according to the invention as shown in FIG. 5 will overcome the earlier cited problems. Unlike all the previous designs, all current sources 10 are organized densely together in the new design. Dummy current sources 9 are placed around the densely laid out current sources 10. No bit switches or decoder function blocks are inserted into the transistor matrix, where the matching is crucial. Also, no digital signals cross the current source matrix.

All the $(2^m-1+1)$ bit switches 14 and their associated flip flops 15 are placed at the upper part. Upon them there is the clock distribution network 11. The segmentation decoder 12 for the m-MSBs and delay equalizer 13 for the 1-LSBs are placed beside the bit switches 14 and flip flops 15. From the clock input to every bit switch, the delay is exactly the same, minimizing the glitch energy.

To reduce noise coupling, separate supplies are used for analog and digital blocks. Double rings are also used (nwell and substrate) to prevent noise coupling via the substrate. The nwell contact ring and p-substrate contact ring surrounding current sources are biased at analog Vdd and ground respectively.

The only problem is the distance difference from current sources to their bit switches. Since the output impedance of the current sources are very high, the parasitic resistance difference due to the wire difference will not change the current value. Therefore, it will not degrade the performance.

This implementation has advantages over the existing designs. Current sources are more densely placed, increasing the matching. There are no digital signals cross current sources and separate digital and analog supplies can be used, decreasing noise coupling. From the clock input to every bit switch, the delay is the same, further reducing the glitch energy.

Figure 6:
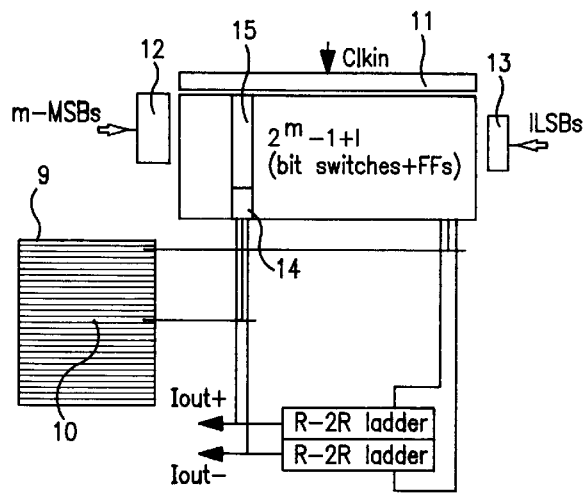
FIG. 6 is a floor plan for the BiCMOS or bipolar D/A converters according to the invention.

For a BICMOS or bipolar implementation, usually the R-2R ladder is preferred to realize binary weighting, in that passive components have a better matching than active components. Such a layout floor plan is shown in FIG. 6. One of the differences is the use of the two R-2R ladders 16. Binary weighting is done by the R-2R ladders 16. The outputs of the 2-2R ladders 16 are directly connected with the segmentation output currents. Current sources, analog circuits, digital circuits, and R-2R ladders can have different supply lines to ease the noise coupling problems.

The crucial circuits in CMOS D/A converters are the current sources and bit switches. The current sources together with bit switches are shown in FIG. 7. They are used in a high-speed high resolution D/A converter, where the 4 MSBs are segmented and the 6 LSBs are binary weighted according to FIG. 5.

P-type transistors are used rather than n-type transistors as current source and cascode transistors. The reason is as follows. When the output current is converted to a voltage by an external resistor, the voltage swing at the output terminal is between 0 and 1 V (or even less, depending on the external resistor). Therefore, n-type transistors can be used as switches to have a faster settling due to the small switch-on resistance. Properly designed p-type current sources have high enough output impedance (in the megaohm range) avoiding using switch transistors as cascode transistors (operating the switch transistors in saturation region).

Figures 7A, 7B:
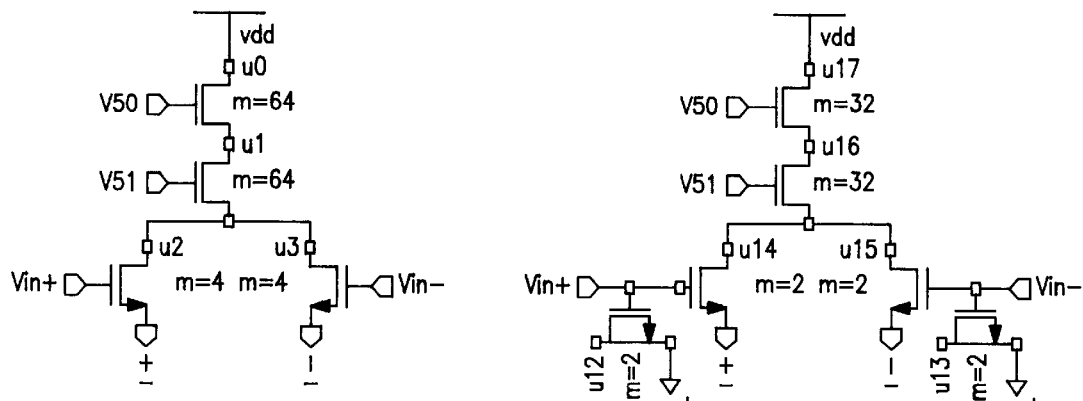
FIG. 7 a–c are circuits for MOS current sources with associated bit switchers.
Figure 7C:
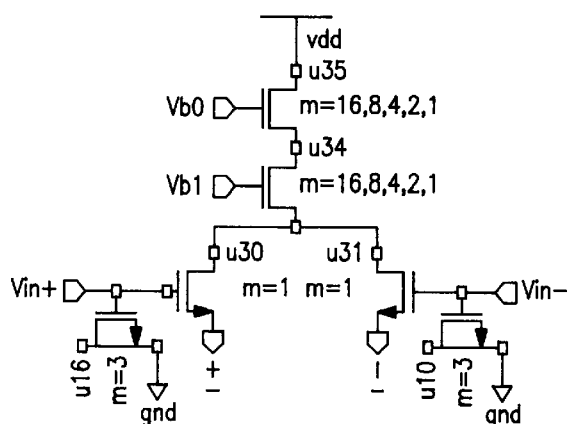

In FIG. 7a is shown the current source (64 unit current sources in parallel) and bit switch (4 unit switch transistors in parallel) for the 4 segmented MSBs. In FIG. 7b is shown the current source (32 unit current sources in parallel) and bit switch (2 unit switch transistors in parallel) for the 6th LSB. In FIG. 7c is shown the current source (16, 8, 4, 2, or 1 unit current sources in parallel) and bit switch (1 unit switch transistor) for the 5th~1st LSBs. To further reduce the glitch energy, the switch transistor sizes are scaled as the currents are scaled, and dummy transistors are used to guarantee equal capacitive load as shown in FIG. 7. Only the 5 LSBs have the identical switch transistors (and dummy transistors), though the currents are different. Since the currents are very small, the influence is very small.

The architecture of FIG. 4a, b and the floor plans of FIG. 5 and 6 may be implemented in chips, as for example a 10-bit CMOS D/A converter chip, a 10-bit 1.5-V CMOS D/A converter chip or a 12-bit BiCMOS D/A converter chip, where the two CMOS chips were laid out according to the floor plan of FIG. 5 and the BiCMOS chip was laid out according to the floor plan of FIG. 6.

While the foregoing description includes numerous details and specificities, it is to be understood that these are merely illustrative of the present invention, and are not to be construed as limitations. Many modifications will be readily apparent to those skilled in the art, which do not depart from the spirit and the scope of the invention, as defined by the appended claims and their legal equivalents.

I claim:

1. A method to provide a high-performance digital-to-analog conversion architecture by combining segmentation for MSBs and binary weighting for LSBs, characterized by using a delay for the binary weighted LSBs to equalize a delay introduced by the segmentation and by clocking all bit switches with a tree-like clock distribution network.

2. The method according to claim 1, characterized by a CMOS implementation and densely laying out only current sources to increase matching and to decrease glitch energy and by organizing the bit switches and this associated clocking circuit in such a way that the delay from the clock input to every bit switch is identical.

3. The method according to claim 1, characterized by a BiCMOS and bipolar implementation and densely laying out current sources to increase matching and to decrease glitch energy and by organizing the bit switches and their associated clocking circuit in such a way that the delay from the clock input to every bit switch is identical.

4. A device to provide a high-performance digital-to-analog conversion architecture by combining segmentation for MSBs and binary weighting for LSBs, characterized in that a delay function is provided for the binary weighted LSBs to equalize a delay introduced by the segmentation and in that all bit switches (14) are provided to be clocked with a tree-like-clock distribution network (11).

5. The device according to claim 4, characterized in that a CMOS implementation is provided, in that current sources are densely laid out to increase matching and to decrease glitch energy and in that bit switches and their associated clocking circuit are organized in such a way that the delay from the clock input to every bit switch is identical.

6. The device according to claim 4, characterized in that a BiCMOS and bipolar implementation are provided, in that current sources are densely laid out to increase matching and to decrease glitch energy and in that bit switches and their associated clocking circuit are organized in such a way that the delay from the clock input to every bit switch is identical.

7. A device to provide a high-performance digital-to-analog conversion architecture by combining segmentation for MSBs and binary weighting for LSBs comprising a circuit realization for CMOS bit switches and current sources, characterized by using p-type transistors as current transistors and n-type transistors as switch, by scaling bit switches as currents are scaled and by adding dummy switch to ensure equal load for bit switch driver.

* * * * *